United States Patent [19]
Gregory et al.

[11] Patent Number: 5,168,321
[45] Date of Patent: Dec. 1, 1992

[54] DOPED-GERMANIUM SENSOR FOR USE IN A SYSTEM TO CONTROL THE ALIGNMENT OF A $CO_2$ LASER BEAM

[75] Inventors: Otto J. Gregory, Wakefield; Kenneth A. Burbank, Coventry, both of R.I.

[73] Assignee: The Board of Governors for Higher Education, State of Rhode Island and Providence Plantations, Providence, R.I.

[21] Appl. No.: 618,048

[22] Filed: Nov. 26, 1990

[51] Int. Cl.⁵ .............. G01B 11/26; G01C 1/00; G01J 5/20; H01L 27/14
[52] U.S. Cl. .................. 356/152; 250/338.4; 250/342; 257/431
[58] Field of Search .............. 356/152; 357/30, 91; 250/338.4, 342

[56] References Cited

U.S. PATENT DOCUMENTS

| | | | |
|---|---|---|---|
| 3,746,454 | 7/1973 | Pace et al. | 356/152 |
| 4,376,659 | 3/1983 | Castro | 357/16 |

Primary Examiner—Stephen C. Buczinski
Attorney, Agent, or Firm—Samuels, Gauthier & Stevens

[57] ABSTRACT

A photoconductive sensor responsive to a $CO_2$ laser beam. The sensor comprises a silver-doped germanium semiconductor. The silver dopant changes the conductive characteristics of the semiconductor which results in the doped germanium semiconductor being responsive to a wavelength range it would not normally be responsive to.

7 Claims, 1 Drawing Sheet

DOPED-GERMANIUM SENSOR FOR USE IN A SYSTEM TO CONTROL THE ALIGNMENT OF A CO₂ LASER BEAM

FIELD OF THE INVENTION

A doped-germanium sensor for use in a system to control the alignment of a $CO_2$ laser beam.

BACKGROUND AND BRIEF SUMMARY OF THE INVENTION

An important factor in the use of lasers is the precision with which the beam is controlled.

Various sensors are used to measure the beam location, usually by measuring variations in beam intensity from a null state, to provide outputs to a control system to adjust the beam alignment.

The prior art includes a variety of different laser control methods including radiometers (Clifford 3,348,047), optics (Kunitsugo 4,867,560), radar (Lloyd 4,738,531), florescence (McClung, Jr. 4,700,068), and mirrors (Anderson 3,579,140). The sensor of choice is usually some type of photoconductive device.

More particularly, U.S. Pat. No. 3,723,013 discloses four quadrant silicon photodetectors used to control the positioning of a laser beam. U.S. Pat. No. 4,243,888 teaches the use of a silicon disk having thermoelectric properties. The reference discloses the absorption of the beam energy by the silicon detector can be controlled by introducing a selected amount of impurities into the silicon. U.S. Pat. No. 4,035,654 teaches the use of a photoconductive sensor wherein a disk, which can be silicon, germanium or zinc selenide, is used as the sensor in the UV range.

In the prior art, the photoconductive sensors are typically specific for the laser beam to be controlled. The present invention is directed to modifying a semiconductor material such as germanium, silicon or silicon carbide to make it specific for a wavelength range it is not normally specific for.

Broadly the invention comprises a doped semiconductor which functions as a photoconductor and is responsive to wavelengths it would not be responsive to in its undoped state. The dopant provides an acceptor or donor state whether functioning as a P-type or N-type semiconductor which has an acceptor level corresponding generally to the energy of the laser light. When the doped semiconductor is exposed to radiation, whose frequency is above a certain threshold, the incoming radiation transfers energy to an electron which then takes on a new energy state in the conduction band and contributes to the electrical conductivity. That is, its resistance decreases and hence its conductivity increases and this change is measured.

In the preferred embodiment of the invention, silver is used to provide an acceptor site in a germanium crystal when $CO_2$ laser light excites the crystal. The germanium is formed in a segmented circular array, with the inwardly directed edges of the segments defining an aperture.

In a preferred embodiment, the invention comprises a photoconductive sensor which includes a doped semiconductor, the dopant changing the conductive characteristics of the semiconductor. An acceptor or a donor site is spaced apart from a band edge in an amount responsive to the power of an incident beam of energy.

DESCRIPTION OF THE PREFERRED EMBODIMENT(S)

Figure 1:
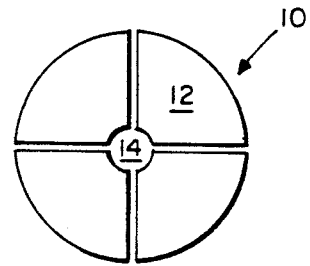
FIG. 1 is a top view of a four quadrant germanium crystal.
Figure 2:
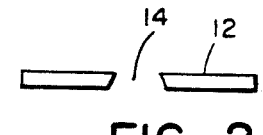
FIG. 2 is a side view of FIG. 1.

Referring to FIG. 1, a circular germanium crystal 10 comprises four quadrants 12 spaced to define a central circular aperture 14. Referring to FIG. 2, the aperture 14 is tapered to a afford a sharper slit for the laser beam. This also lowers the adsorption if the beam is misaligned.

Figure 4:
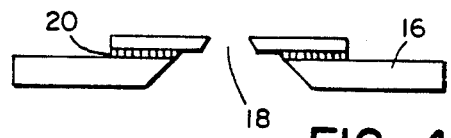
FIG. 4 is a side view of FIG. 3.
Figure 3:
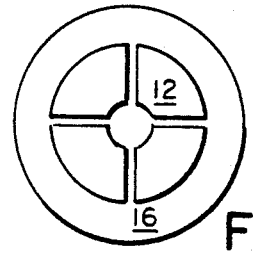
FIG. 3 is a top view showing one quadrant positioned on a substrate.

To provide mechanical stability as well as heat sinking, the germanium crystal 10 is placed on a substrate 16 as shown in FIGS. 3 and 4. Anodized aluminum or tin may be used as the substrate. The substrate also has a central circular aperture 18 which is tapered and slightly larger than the aperture 14. The taper in the substrate 18 provides for the centering of a waveguide 24, shown in FIG. 6, as well as a mechanical stop so that the waveguide cannot come into contact with the crystal 10. Also because of the amount of heat energy involved with lasers, to protect the germanium a layer of insulation 20 is placed between the germanium and the substrate. Conventional techniques known in art may be used to bind the crystal to the substrate. This layer can be a thermally conductive adhesive to bond the crystal to the substrate. Once this is done, metallization for contacts to the quadrants may be completed using standard type processing.

Figure 5:
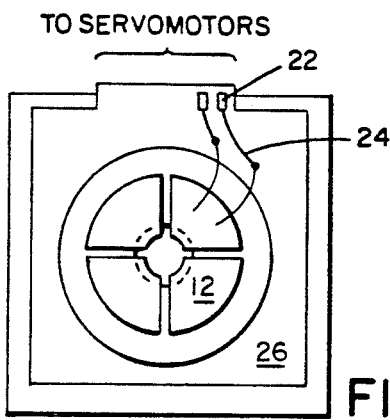
FIG. 5 is a plan view of an assembled sensor.

Referring to FIG. 5, the doped germanium crystal 10 is connected, according to prior art methods, i.e. hybrid techniques, by pad 22 and gold wire to a circuit board 26 which surrounds the crystal 10-substrate 16. The circuit board 26 includes an edge connector 30 and controls servo motors (not shown) which position the beam. The control system monitors the photoconductive response in each quadrant. When there are unequal responses from the quadrants (the laser beam has moved out of alignment) the laser will be moved in the opposite direction of where the strongest response is located.

Figure 6:
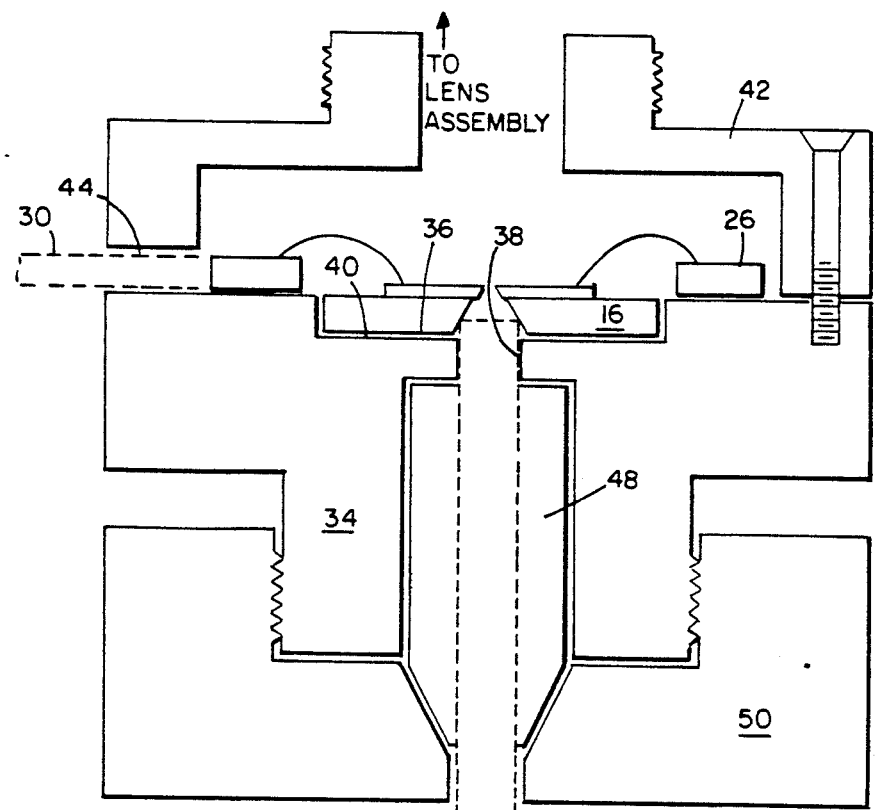
FIG. 6 is a schematic of a waveguide assembly.

Referring to FIG. 6, the waveguide assembly is shown generally at 32 and comprises a sensor block 34 having a circular recess 36 which is centrally apertured at 38. The crystal 10-substrate 16 is secured within the recess 36. The sensor block 34 includes an upper surface 40. The circuit board 26 is secured to the surface 40. An annular sleeve 42 is joined to the sensor block and includes a recess at 44 through which the edge connector 30 passes. The dimensioning of the edge connector and the recess is such that light does not pass through the recess. The waveguide 46 is secured by a chamfered collet 48. The waveguide is centered by the chamfered surfaces of the substrate 16. The sensor substrate is epoxied in place using a thermally conductive epoxy which further aids in heat sinking the device. A locking nut 50 secures the sensor block 34 and collet 48 in place.

The purpose of the sensor is to keep the beam centered in the aperture. Approximately 5–10% of the laser beam's power is in the edge or "skirts" or "tails" of the beam. This reduced power is able to produce a useful signal. This keeps most of the laser's power away from the crystal. When the beam is centered, the power in the beam skirt will be equal on the four sensors 12 If the beam moves towards any quadrant, more power will be incident on that quadrant providing a larger photoconductive change in turn providing a feedback signal to reposition the beam. Thus, the detector will notice changes in the $CO_2$ laser beam position using a photoconduction response usually much more rapid than currently available positioning circuitry can handle.

In the preferred embodiment of the invention, a HeNe laser is used to provide a visible light for beam positioning before full power is applied. This wavelength (red) is greater than the band gap for germanium, so band-to-band transitions should occur with a change in conductivity. This much weaker beam can be used for course positioning of the beam positioning optics to help avoid having the main $CO_2$ beam used which could strike and possibly damage the sensor. To increase the change in conductivity due to the HeNe laser, the Ge should have no impurities that are ionized at room temperature.

The $CO_2$ laser light is 10.6 $\mu$m which is $\sim$ 117 mv, which is $\sim$ four times the room temperature KT. By providing an acceptor or donor state, $\delta$ 117 mv from a band edge, the $CO_2$ laser can be detected with an adequate signal-to-noise ratio. Preferably, silver is used for the doping as it has an acceptor level at $\sim$ 90 mv. In general, germanium is transparent to the $CO_2$ laser wavelength. The sensor must be able to withstand direct exposure to the $CO_2$ laser with a 350 $\mu$m spot size and $\leq$30 w of incident power. The inherent transparency of the Ge will allow most of the power to be transmitted without damaging the crystal. The silver impurity level is controlled to prevent excessive absorption and subsequent heating and damage to the Ge crystal.

The Ge starts as a circular slice of single crystal Ge and the doping is done by ion implantation. The resistivity of the doped germanium is approximately 1-10 ohm cm, preferably 1-5 ohm cm. Subsequently, the center hole and quadrants are formed. The Ge is aligned and bonded to the substrate using thermally conductive adhesive.

If the signal derived from the sensor is too low, the surface area exposed can be increased. It is known to form uniform striations on a Ge (110) surface. There are approximately four striations in 10 $\mu$m which is $\sim \lambda/4$ for the $CO_2$. Thus, the striations will effectively increase the surface area exposed and should increase the absorption. *Native Oxides formed on Single-Crystal Germanium by Wet Chemical Reactions*, O. J. Gregory, L. A. Pruitt, E. E. Crisman, C. Roberts, and P. J. Stiles, JECS, 135:923 (1988), incorporated by referenced in its entirety into this disclosure, demonstrates that it is possible to uniformly place striations on a germanium surface.

A layer of silicon dioxide can be coated on the germanium. This layer can thermally excite an electron to the acceptor state which will further enhance the signal. Also, it will help to disperse the beam to increase the area it covers, which will increase the signal.

Although described with reference to silver doped Ge, zinc doped silicon, chromium doped germanium and mercury doped germanium are also believed suitable.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described our invention, what we now claim is:

1. A photoconductive sensor responsive to a laser beam which sensor comprises a doped semiconductor, the semiconductor being germanium and the dopant silver, the dopant changing the conductive characteristics of the semiconductor, the doped semiconductor being responsive to a wavelength range of an incident beam that the semiconductor would not be responsive to in its undoped state.

2. The sensor of claim 1 wherein the sensor is photoconduction responsive to $CO_2$ laser light.

3. The sensor of claim 1 wherein the semiconductor comprises four quadrants arrayed in a circular pattern, the vertices of the quadrants defining a central aperture.

4. The sensor of claim 1, wherein the surface of the sensor includes a plurality of striations thereon.

5. The sensor of claim 1, or to 3 which comprises:
means to secure the sensor to a substrate; and
means to secure the substrate to a sensor block.

6. A method for detecting carbon dioxide laser light which includes:
contacting a sensor comprising a germanium semiconductor doped with silver with an incident beam of light, the sensor being responsive to a wavelength range of the incident beam to the light in its doped state which the sensor would not be responsive to in its undoped state; and
providing an output from the sensor to a control system whereby the position of the beam striking the sensor can be controlled.

7. The method of claim 6 wherein the sensor is photoconduction responsive to $CO_2$ laser light.

* * * * *